(12) United States Patent
Kanemoto

(10) Patent No.: US 7,488,666 B2
(45) Date of Patent: Feb. 10, 2009

(54) METHOD FOR MANUFACTURING SEMICONDUCTOR SUBSTRATE AND METHOD FOR MANUFACTURING SEMICONDUCTOR DEVICE

(75) Inventor: Kei Kanemoto, Fujimi-cho (JP)

(73) Assignee: Seiko Epson Corporation, Tokyo (JP)

( * ) Notice: Subject to any disclaimer, the term of this patent is extended or adjusted under 35 U.S.C. 154(b) by 294 days.

(21) Appl. No.: 11/605,606

(22) Filed: Nov. 29, 2006

(65) Prior Publication Data

US 2007/0132025 A1 Jun. 14, 2007

(30) Foreign Application Priority Data

Dec. 13, 2005 (JP) ............................. 2005-358581

(51) Int. Cl.
*H01L 21/302* (2006.01)
*H01L 21/461* (2006.01)

(52) U.S. Cl. .................. 438/424; 438/149; 438/425; 438/427; 438/739; 257/E21.115; 257/E21.116

(58) Field of Classification Search ............... 438/404, 438/405, 416, 417, 421, 422, 442, 479, 481–484, 438/486, 590, 690–693, 700, 719, 734–735, 438/737–739, 149, 751–753, 761–763, 765, 438/767, 769, 779, FOR. 131, 424, 425, 427, 438/412; 257/E21.09, E21.093–E21.094, 257/E21.102–E21.103, E21.115–E21.116
See application file for complete search history.

(56) References Cited

U.S. PATENT DOCUMENTS

2005/0009263 A1* 1/2005 Yeo et al. ................... 438/221

(Continued)

FOREIGN PATENT DOCUMENTS

JP 2006-100681 A 4/2006

(Continued)

OTHER PUBLICATIONS

T. Sakai et al., Separation by Bonding Si Islands (SBSI) for LSI Applications, Second International SiGe Technology and Device Meeting, Meeting Abstract, May 2004, pp. 230-231.

*Primary Examiner*—M. Wilczewski
*Assistant Examiner*—Joseph C Nicely
(74) *Attorney, Agent, or Firm*—AdvantEdge Law Group, LLC

(57) ABSTRACT

A method for manufacturing a semiconductor substrate comprises: forming a silicon on insulator (SOI) area and an element isolation film on a semiconductor base; forming a first semiconductor layer on the semiconductor base in the SOI structure area; forming a second semiconductor layer having an etching selection ratio smaller than an etching selection ratio of the first semiconductor layer on the first semiconductor layer; removing a part of the second semiconductor layer and a part of the first semiconductor layer in the SOI structure area so as to form a recess exposing the semiconductor base and supporting a support; forming a support forming layer on the semiconductor base so as to bury the recess and cover the second semiconductor layer; etching an area excluding the recess, the element area, and an area covering the element isolation film so as to form the support and an opening face exposing a part of end parts of the first semiconductor layer and the second semiconductor layer, the opening face being positioned under the support; removing the first semiconductor layer and the second semiconductor layer that are disposed at a border between the element isolation film and the SOI structure area and in a vicinity of the border; etching the first semiconductor layer through the opening face so as to form a cavity between the second semiconductor layer and the semiconductor base; forming a buried insulation layer in the cavity; forming an insulation film above the second semiconductor layer; and planarizing above the second semiconductor layer so as to remove a part of the support.

3 Claims, 14 Drawing Sheets

U.S. PATENT DOCUMENTS

| | | | |
|---|---|---|---|
| 2005/0048745 A1* | 3/2005 | Todd | 438/489 |
| 2006/0138541 A1* | 6/2006 | Nakamura et al. | 257/347 |
| 2007/0102735 A1* | 5/2007 | Kanemoto et al. | 257/288 |
| 2007/0126034 A1* | 6/2007 | Sakai et al. | 257/288 |
| 2007/0132026 A1* | 6/2007 | Kanemoto | 257/347 |
| 2007/0134885 A1* | 6/2007 | Kanemoto | 438/424 |
| 2007/0138512 A1* | 6/2007 | Kanemoto | 257/211 |
| 2007/0138553 A1* | 6/2007 | Kanemoto | 257/347 |
| 2007/0148832 A1* | 6/2007 | Kanemoto | 438/149 |
| 2008/0026511 A1* | 1/2008 | Kanemoto | 438/149 |
| 2008/0045023 A1* | 2/2008 | Kanemoto | 438/697 |
| 2008/0132043 A1* | 6/2008 | Kanemoto | 438/492 |

FOREIGN PATENT DOCUMENTS

| | | |
|---|---|---|
| JP | 2006-108206 A | 4/2006 |
| JP | 2006-210683 | 8/2006 |
| JP | 2006210552 A * | 8/2006 |

* cited by examiner

METHOD FOR MANUFACTURING SEMICONDUCTOR SUBSTRATE AND METHOD FOR MANUFACTURING SEMICONDUCTOR DEVICE

BACKGROUND

1. Technical Field

The present invention relates to a method for manufacturing a semiconductor substrate, and a method for manufacturing a semiconductor device, and particularly relates to a technique to form a silicon-on-insulator (SOI) structure on a semiconductor substrate.

2. Related Art

Field effect transistors formed on an SOI substrate have a huge benefit that semiconductor devices can be provided with low power consumption and operated with high speed due to smaller junction capacitance (capacitance between a source region and a substrate, and between a drain region and the substrate) compared to that of the transistors formed on a bulk silicon substrate.

In general, an SOI substrate is prepared in which an SOI structure is formed on the entire surface of a bulk silicon substrate. On the SOI structure, transistors are formed in order. The SOI structure is removed from an area in which the SOI structure is not needed.

A separation by bonding Si islands (SBSI) method capable of manufacturing an SOI transistor with low costs by partially forming an SOI layer on a bulk substrate is disclosed in T, Sakai et al., Second International SiGe Technology and Device Meeting, Meeting Abstract, pp. 230-231, May (2004). For example, when a related art bulk CMOS and a CMOS having an SOI structure are mixedly fabricated on a bulk silicon substrate by applying the SBSI method, first, an oxide film and a nitride film are formed on the silicon substrate in order. Then, the nitride film at a position, to which an isolation film for isolating an SOI structure area and a bulk area is formed, is removed so as to form an element isolation film (local oxidization of silicon (LOCOS) film) by a LOCOS process. Subsequently, the nitride film and the oxide film in an SOI structure area are removed. On the silicon substrate exposed after the oxide film is removed, a silicon germanium (SiGe) layer and a silicon (Si) layer are epitaxially grown. A hole to form a support (support hole) is formed there. After an oxide film for forming a support or the like is formed over them, the oxide film, the silicon layer, and the silicon-germanium layer are dry etched from the periphery of an element area shape to be achieved. When the silicon germanium layer is selectively etched with hydrofluoric-nitric acid, the silicon layer is held by the support and a cavity is formed under the silicon layer. Then, an insulation layer such as $SiO_2$ is plugged into the cavity, thereby forming a buried oxide (BOX) layer between the silicon substrate and the silicon layer. Subsequently, a planarization treatment is performed on the substrate surface so as to expose a silicon layer, whereby an SOI structure is achieved on the bulk silicon substrate.

In etching the silicon germanium layer, the silicon layer and the film for forming the support is supported as a cantilever by the LOCOS film, which acts as a supporting part, in the vicinity of a border between the LOCOS film serving as an element isolation film and the SOI structure area.

This matter will be described with reference to FIGS. 14A through 14C as an example. FIGS. 14A through 14C show a semiconductor substrate having an SOI structure in a manufacturing process. FIG. 14A is a schematic plan view. FIG. 14B is a schematic sectional-view taken along the line $A_{14}$-$A'_{14}$ in FIG. 14A. FIG. 14C is a schematic sectional-view showing a subsequent process of that shown in FIG. 14B.

First, a LOCOS film 84 serving as an element isolation film is formed on a silicon substrate 81 so as to surround T2 that becomes an SOI structure area. Then, on the silicon substrate 81, a silicon germanium layer 85 and a silicon layer 86 are epitaxially grown. In this regard, on the LOCOS film 84, silicon germanium is not grown but a polysilicon layer 86a made of polycrystalline silicon is formed under a predetermined film forming condition. Next, support holes 87 are formed in the SOI structure area, and then a support forming film 88 is formed so as to bury the support holes 87, and cover a silicon layer 86 and a polysilicon layer 86a. On the support forming film 88, a photoresisit film is formed. The photoresisit film is patterned so as to form a photoresisit pattern 91 having the outer shape of the support and a shape covering the LOCOS film 84. With the photoresist pattern 91, the support forming film 88 is etched so as to form a support 88a as shown in FIG. 14B. Then, as shown in FIG. 14C, the silicon germanium layer 85 is selectively etched, whereby the silicon layer 86 is held by the support 88a and a cavity G2 is formed under the silicon layer 86. In etching the silicon germanium layer 85, a cavity is also formed under the silicon layer 86 in the vicinity of a border between the LOCOS film 84 and the SOI structure area T2, whereby the silicon layer 86 and the support forming film 88 are supported by the polysilicon layer 86a on the LOCOS film 84 as a cantilever.

Since the silicon layer 86 and the support forming layer 88 that are supported as a cantilever are extremely-thin and very brittle, they may arise a problem in that they are dropped off and adhere on other areas in a later process, thereby lowering a manufacturing yield of a semiconductor substrate 80.

SUMMARY

An advantage of the invention is to provide a method for stably manufacturing a semiconductor substrate and a semiconductor device without lowering a yield rate when a semiconductor substrate and a semiconductor device are manufactured that have an element isolation film and an SOI structure area on a bulk silicon substrate.

A method for manufacturing a semiconductor substrate according to a first aspect of the invention includes: forming a silicon on insulator (SOI) area and an element isolation film on a semiconductor base; forming a first semiconductor layer on the semiconductor base in the SOI structure area; forming a second semiconductor layer having an etching selection ratio smaller than an etching selection ratio of the first semiconductor layer on the first semiconductor layer; removing a part of the second semiconductor layer and a part of the first semiconductor layer in the SOI structure area so as to form a recess exposing the semiconductor base and supporting a support; forming a support forming layer on the semiconductor base so as to bury the recess and cover the second semiconductor layer; etching an area excluding the recess, an element area, and an area covering the element isolation film so as to form the support and an opening face that is positioned under the support and exposes a part of end parts of the first semiconductor layer and the second semiconductor layer; removing the first semiconductor layer and the second semiconductor layer that are disposed in the vicinity of a border between the element isolation film and the SOI structure area; etching the first semiconductor layer through the opening face so as to form a cavity between the second semiconductor layer and the semiconductor base; forming a buried insulation layer in the cavity; forming an insulation film above the second semiconductor layer; and planarizing above the second semiconductor layer so as to remove a part of the support.

When a semiconductor substrate is manufactured by the method, the second semiconductor layer and the support forming layer are layered and formed also on the element isolation film. The second semiconductor layer and the support forming layer on the element isolation film need to remain in order to protect the element isolation film in an initial stage when the support and the opening face, which is positioned under the support and exposes a part of the end parts of the first and second semiconductor layers, are formed. In the method, the second semiconductor layer and the support forming layer are removed so as not to remain in the vicinity of the border between the element isolation film and the SOI structure area by forming the etching resist pattern on the element forming film so as not to cover the SOI structure area. Accordingly, the second semiconductor layer is not formed as a cantilever when the cavity is formed between the second semiconductor layer and the semiconductor base in the element area by etching the first semiconductor layer later. Therefore, a problem does not arise in that the end part of each layer that is formed as a cantilever is peeled off in a later process and adheres on a semiconductor substrate in process. As a result, a method for manufacturing a semiconductor substrate can be provided that achieves a stable production and a high yield rate.

In the method, the first semiconductor layer is preferably a silicon germanium layer while the second semiconductor layer is preferably a silicon layer.

Since silicon has an etching selection ratio smaller than that of silicon germanium, in the method, the silicon germanium layer can be selectively etched and removed while the silicon layer remains, whereby the cavity can easily be formed under the silicon layer.

A method for manufacturing a semiconductor device according to a second aspect of the invention includes forming a transistor on the second semiconductor layer after performing the method for manufacturing a semiconductor device.

The method for manufacturing a semiconductor device prevents the second semiconductor layer and the support forming layer from being formed as a cantilever on the element isolation film in the vicinity of the circumference of the SOI structure area, since the semiconductor substrate is used that is manufactured by the method of the first aspect of the invention. Therefore, a problem does not arise in that the end part of each layer that is formed as a cantilever is peeled off in a later process and adheres on a semiconductor substrate in process. As a result, a method for manufacturing a semiconductor device can be provided that achieves a stable production and a high yield rate.

BRIEF DESCRIPTION OF DRAWINGS

The invention will be described with reference to the accompanying drawings, wherein like numbers reference like elements.

DESCRIPTION OF EXEMPLARY EMBODIMENTS

Embodiments of the invention will be described with reference to the accompanying drawings.

First Embodiment

FIGS. 1A through 13B are schematic views showing a method for manufacturing a semiconductor device according to a first embodiment of the invention. Specifically, in FIGS. 1A through 13B, each figure suffixed "with the letter A is a schematic plan view while each figure suffixed with". the letter B is a schematic sectional view taken along the line A-A' in respective figures suffixed with the letter A. In the first embodiment, a method for forming a CMOS having an SOI structure is described when the CMOS having an SOI structure and a related art bulk CMOS are mixedly fabricated on a bulk silicon substrate. The outline of the SOI structure is shown with a dot-line in each figure.

Figure 1A:
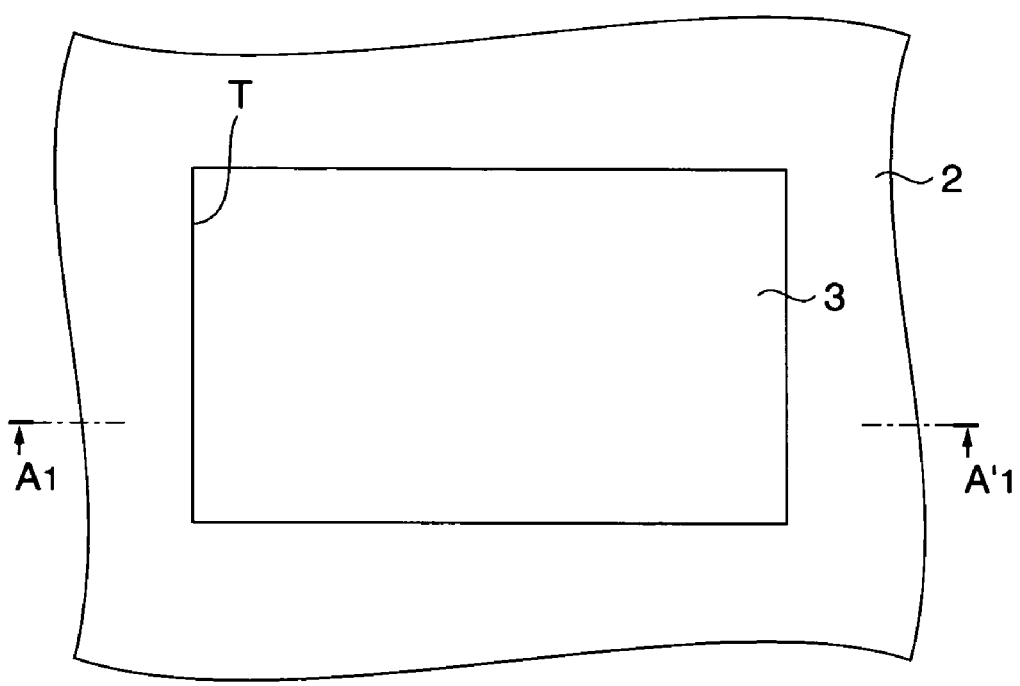
FIGS. 1A and 1B are schematic process views illustrating a method for manufacturing a semiconductor substrate according to a first embodiment of the invention.
Figure 1B:
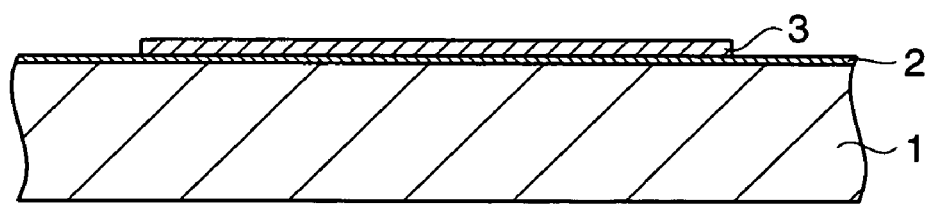

In FIGS. 1A and 1B, first, a silicon oxide ($SiO_2$) film 2 is thinly formed on the entire surface of a silicon substrate 1, which is a bulk silicon wafer serving as a semiconductor base, and then a silicon nitride film 3 is formed on an area, which will become an SOI structure area T as described later, by patterning.

Figure 2A:
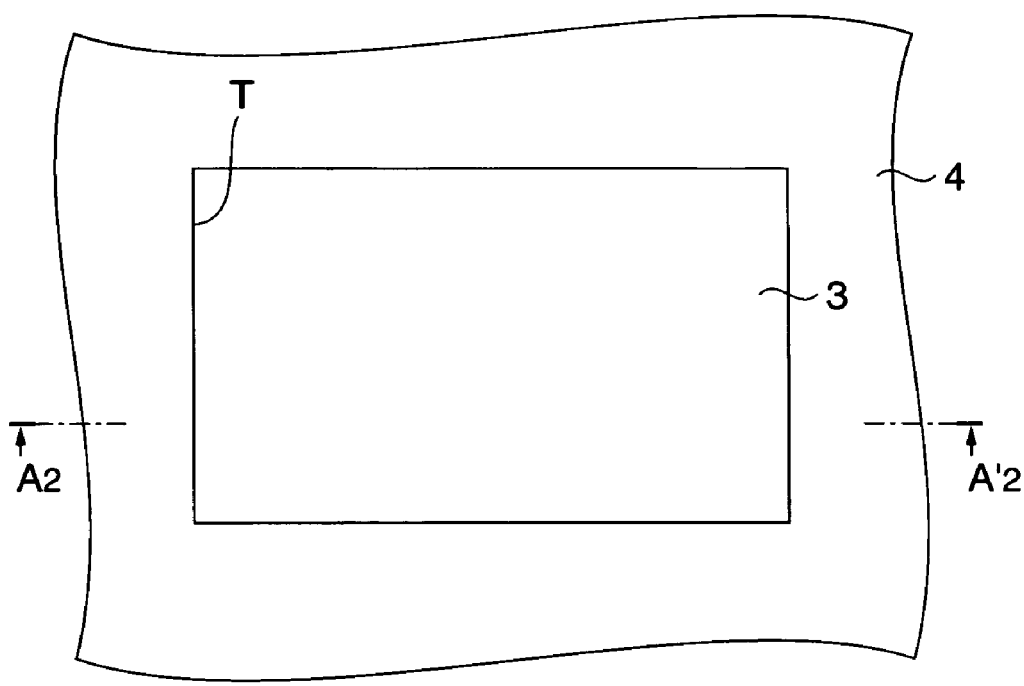
FIGS. 2A and 2B are schematic process views illustrating a method for manufacturing a semiconductor substrate according to the first embodiment of the invention.
Figure 2B:
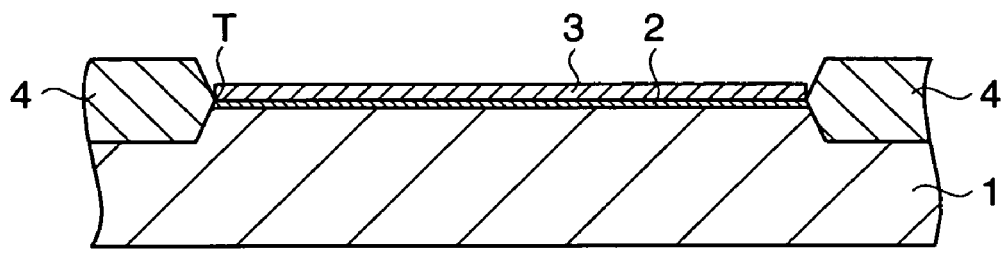

Then, as shown in FIGS. 2A and 2B, a LOCOS film 4 serving as an element isolation film is formed by oxidizing the silicon substrate 1. The LOCOS film 4 is formed on an area surrounding the silicon nitride film 3 in an annular and rectangular shape in a plan view, and not formed on the silicon nitride film 3 that does not permeate oxygen. The area on which the silicon nitride film 3 is formed becomes the SOI structure area T for forming a semiconductor element having an SOI structure on the silicon substrate 1.

Figure 3A:
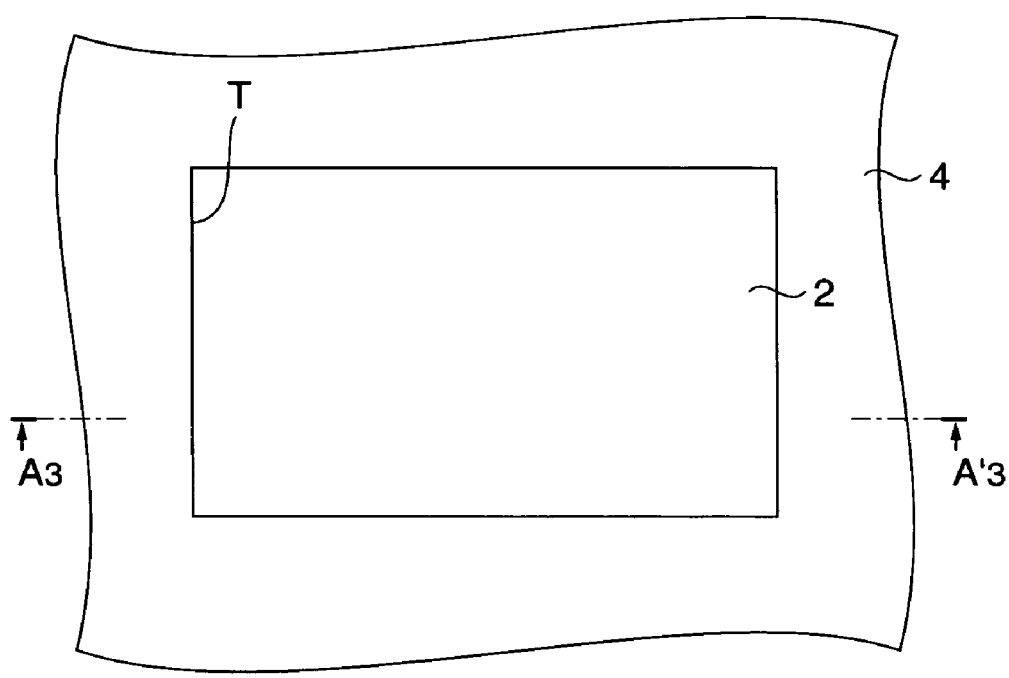
FIGS. 3A and 3B are schematic process views illustrating a method for manufacturing a semiconductor substrate according to the first embodiment of the invention.
Figure 3B:
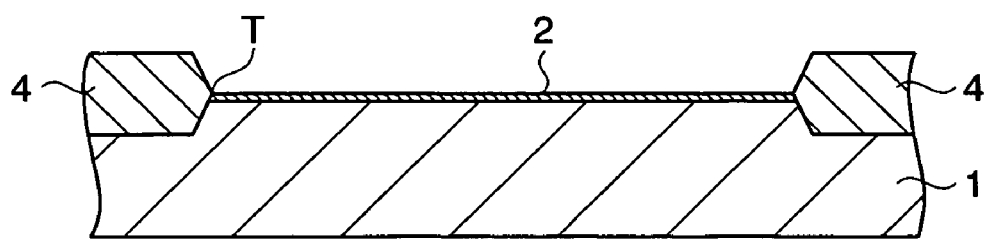

Next, the silicon nitride film 3 is etched with thermal phosphoric acid. Since thermal phosphoric acid has selectivity that it etches the silicon nitride film 3, but does not etch the silicon oxide film 2, only the silicon nitride film 3 is removed so that the silicon oxide film 2 is exposed as shown in FIGS. 3A and 3B.

Figure 4A:
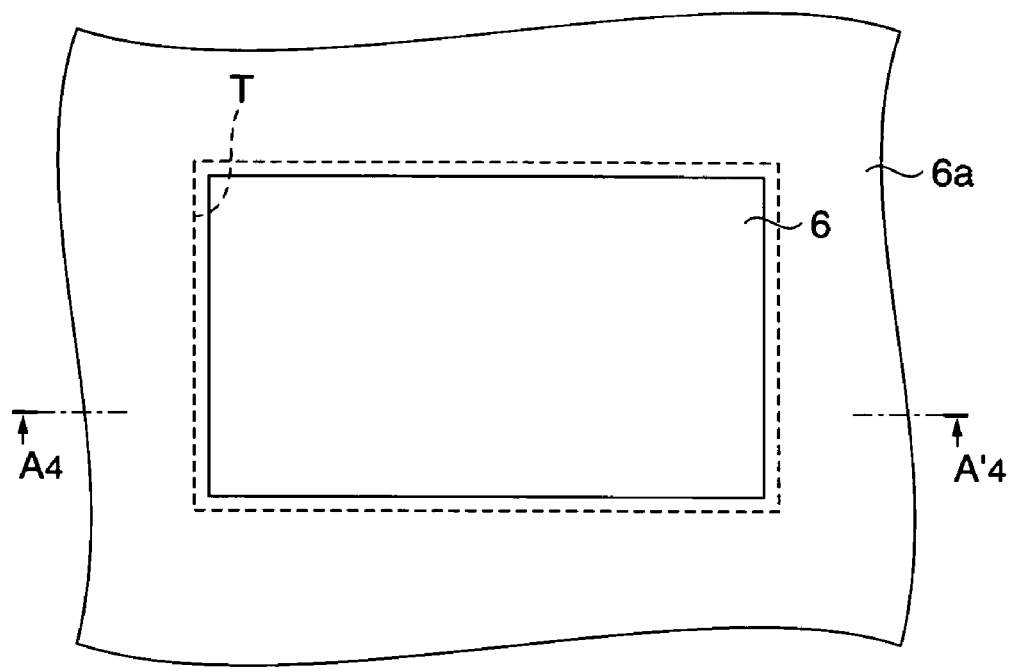
FIGS. 4A and 4B are schematic process views illustrating a method for manufacturing a semiconductor substrate according to the first embodiment of the invention.
Figure 4B:
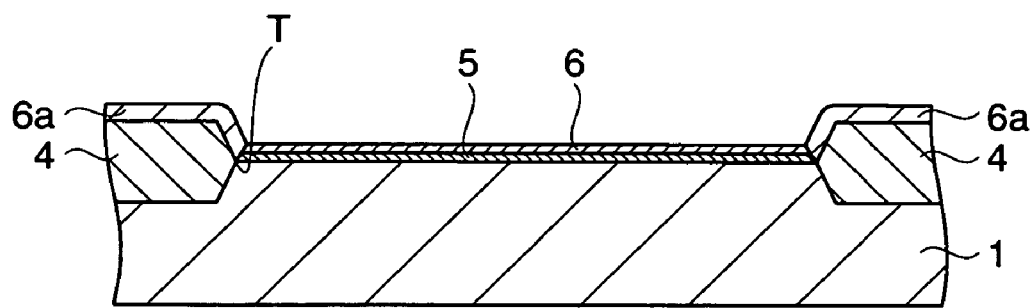

Then, the silicon oxide film 2 on the SOI structure area T is removed. Subsequently, a silicon germanium (SiGe) layer 5 is formed as a first semiconductor layer and a silicon (Si) layer 6 is formed as a second semiconductor layer on the layer 5. The silicon germanium layer 5 and the silicon layer 6 are formed by epitaxial growth. In this regard, the epitaxial growth of the silicon germanium layer 5 is performed under a film forming condition by which a silicon germanium layer does not grow on the LOCOS film 4 by controlling heating temperature, for example. As a result, the silicon germanium layer 5 and the silicon layer 6 are layered in this order on the surface of the silicon substrate 1 in the SOI structure area T, while a polysilicon layer 6a, which is polycrystalized, is formed on the LOCOS film 4 as shown in FIGS. 4A and 4B.

Figure 5A:
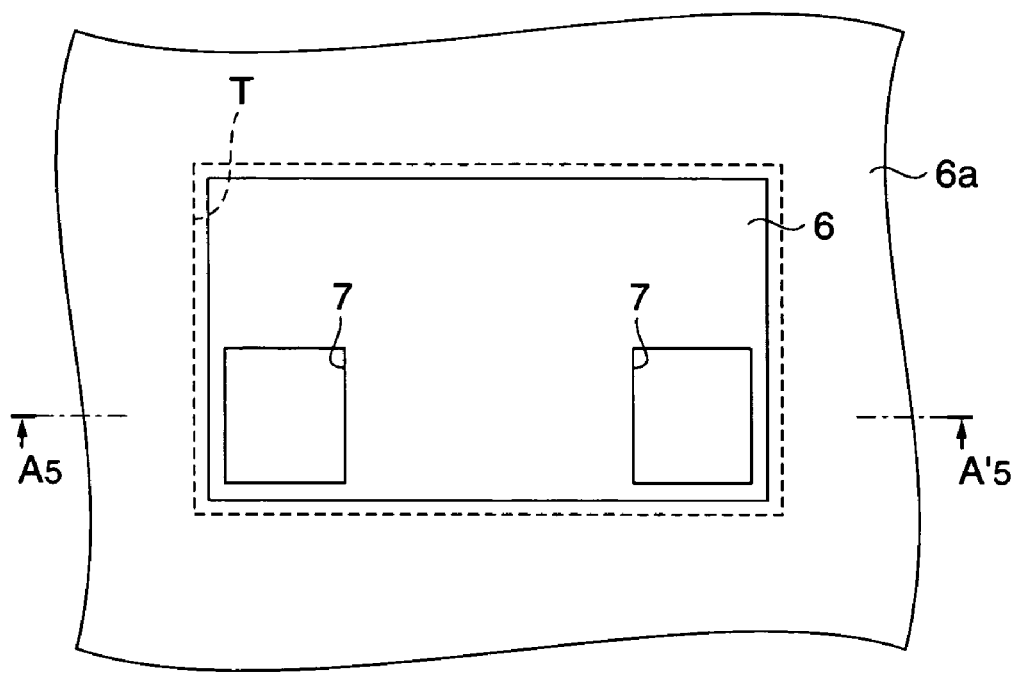
FIGS. 5A and 5B are schematic process views illustrating a method for manufacturing a semiconductor substrate according to the first embodiment of the invention.
Figure 5B:
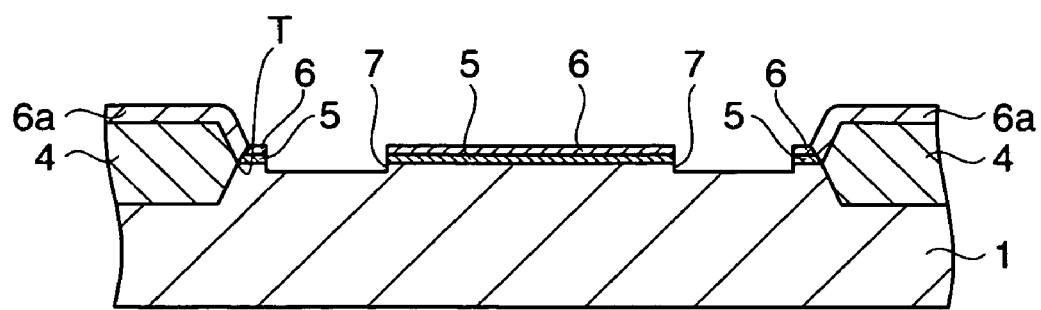

On the silicon substrate 1, a photoresist is coated and patterned so as to form a photoresist pattern (not shown) for forming a recess for a support in the SOI structure area T. Then, the silicon layer 6 and the silicon germanium layer 5 are etched in this order by using the photoresist pattern for forming a recess as a mask. Further, the surface of the silicon substrate 1, which has been resultantly exposed, is etched by a predetermined amount so as to form recesses 7 for a support. After the recesses 7 are formed, the photoresist pattern for forming a recess is removed as shown in FIGS. 5A and 5B.

Figure 6A:
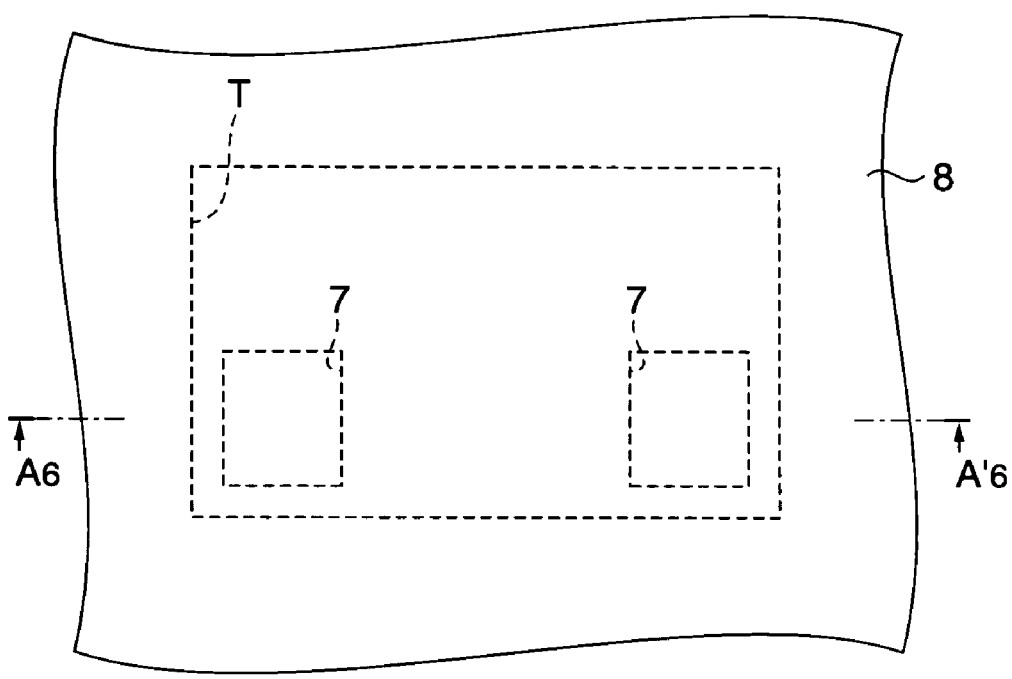
FIGS. 6A and 6B are schematic process views illustrating a method for manufacturing a semiconductor substrate according to the first embodiment of the invention.
Figure 6B:
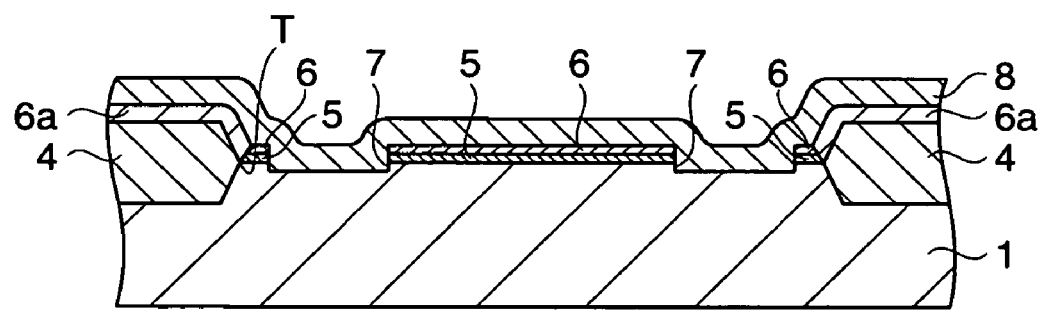

Next, as shown in FIGS. 6A and 6B, a support forming film 8, which is made of $SiO_2$, for example, is formed over the silicon substrate 1 by CVD or the like, so as to bury the recesses 7 and to cover the silicon layer 6 and the polysilicon layer 6a.

Figure 7A:
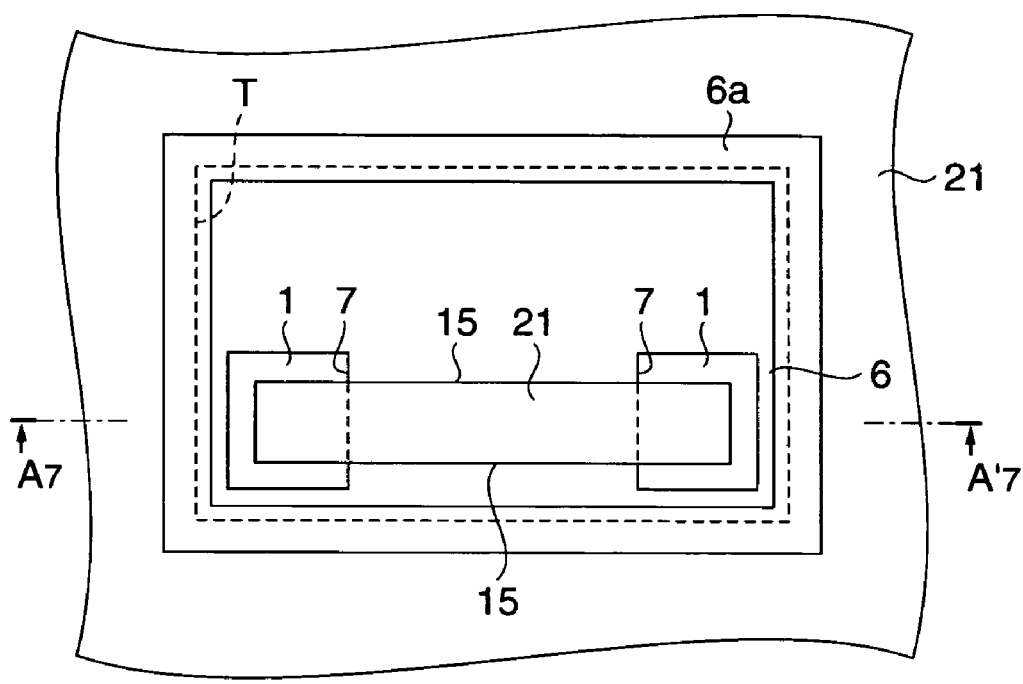
FIGS. 7A and 7B are schematic process views illustrating a method for manufacturing a semiconductor substrate according to the first embodiment of the invention.
Figure 7B:
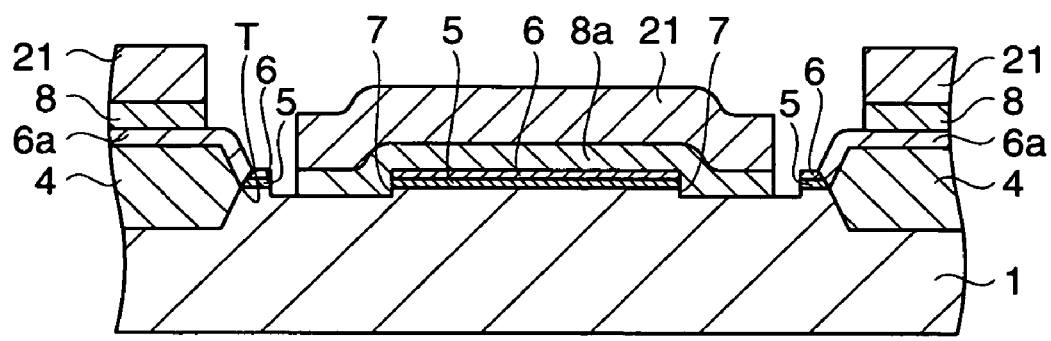
Figure 8A:
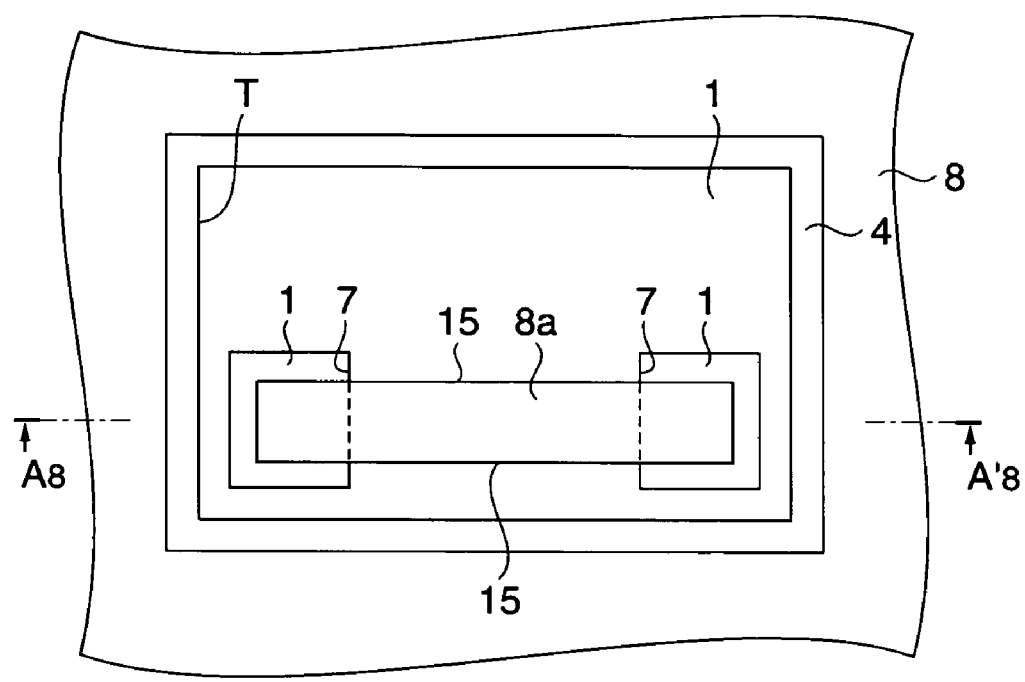
FIGS. 8A and 8B are schematic process views illustrating a method for manufacturing a semiconductor substrate according to the first embodiment of the invention.
Figure 8B:
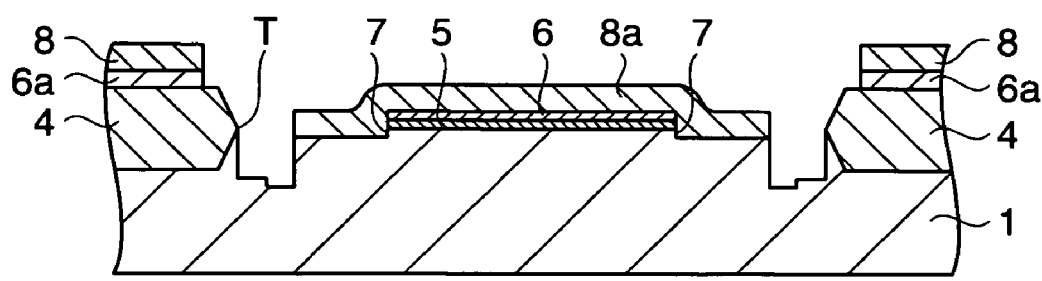

On the support forming film 8, a photoresist is coated and patterned into the planer shape of a support so as to form a photoresist pattern 21. The photoresist pattern 21 forms the planer shape pattern of the support and a pattern to mask the LOCOS film 4. In this case, the pattern to mask the LOCOS film 4 is formed into a shape masking the LOCOS film 4 from a position that is slightly inside the LOCOS film 4 from the border between the SOI structure area T and the LOCOS film 4. The photoresist pattern 21 is used as a mask to etch the support forming film 8 so as to form a support 8a as shown in FIGS. 7A and 7B. Here, the pattern to mask the LOCOS film 4 may be formed on the LOCOS film 4 from the border with the SOI structure area T if the pattern does not fall on the SOI structure area T.

Subsequently, the silicon layer 6, the polysilicon layer 6a, and the silicon germanium layer 5 are dry etched in this order. Further, the etching proceeds until the silicon substrate 1, which is resultingly exposed, is etched by a predetermined amount. The etching removes the silicon layer 6 and the silicon germanium layer 5 so that they remain only on the silicon substrate 1 directly under the support 8a. Additionally, side faces 15 under the support 8a are opening faces at which the silicon layer 6 and the silicon germanium layer 5 are exposed. After the etching is finished, the photoresist pattern 21 is removed.

Figure 9A:
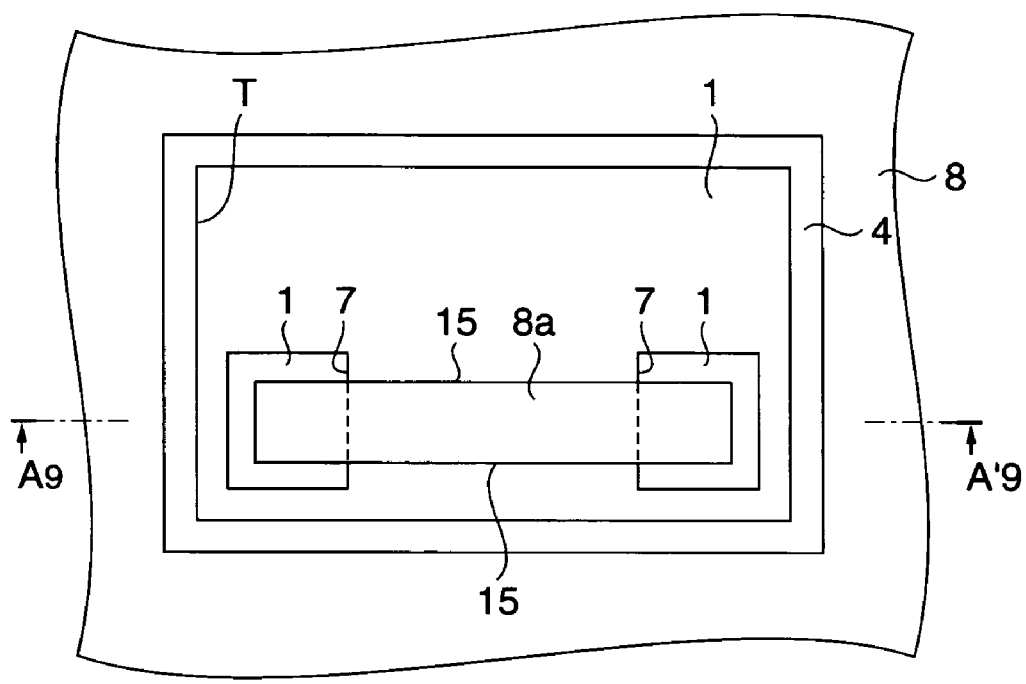
FIGS. 9A and 9B are schematic process views illustrating a method for manufacturing a semiconductor substrate according to the first embodiment of the invention.
Figure 9B:
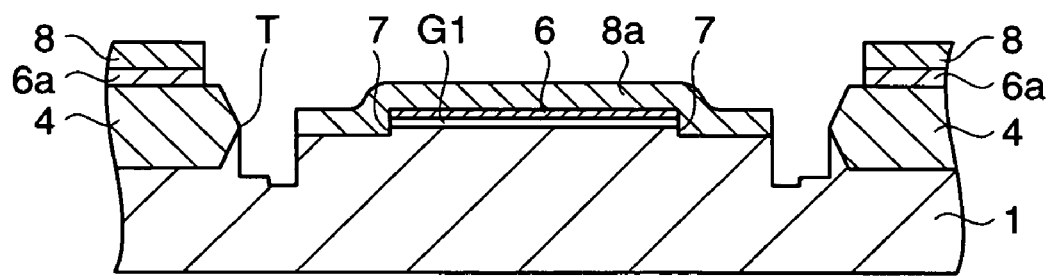
Figure 10A:
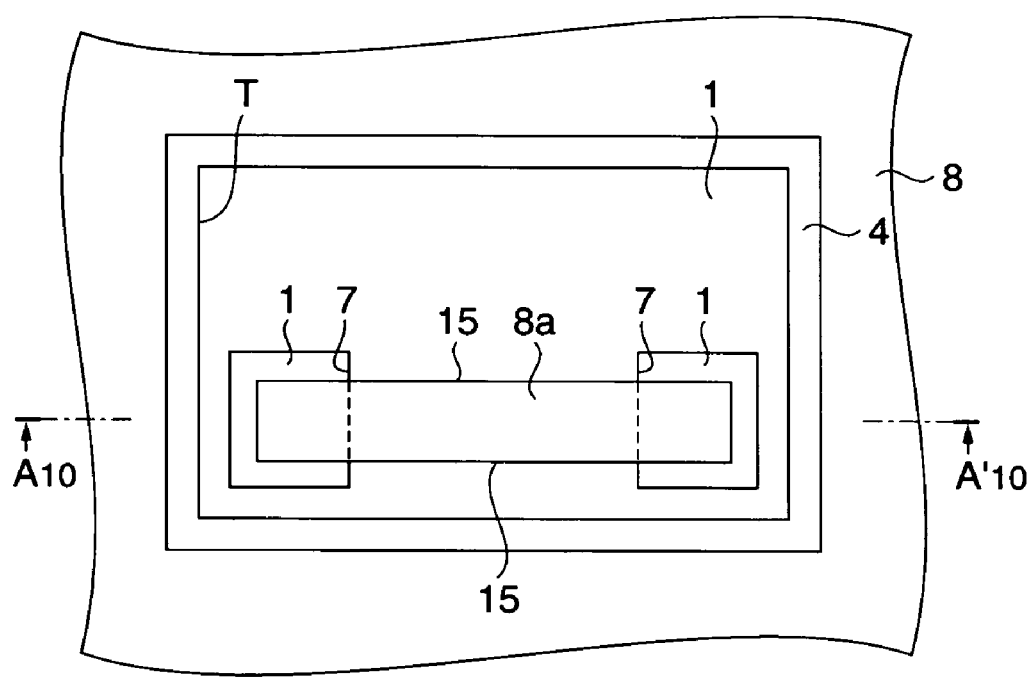
FIGS. 10A and 10B are schematic process views illustrating a method for manufacturing a semiconductor substrate according to the first embodiment of the invention.
Figure 10B:
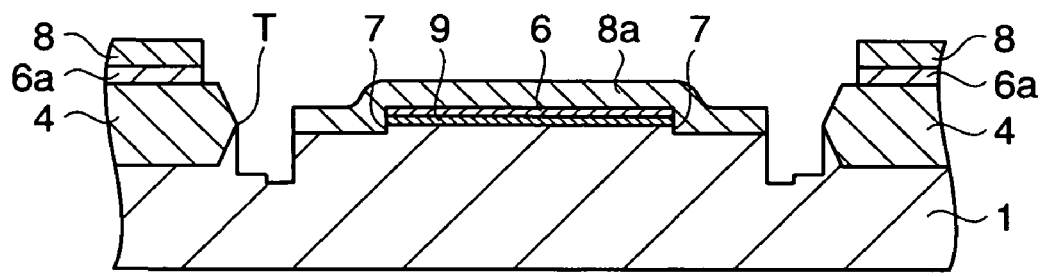

Then, as shown in FIGS. 9A and 9B, the silicon germanium layer 5 is selectively etched and removed by contacting the silicon layer 6 and the silicon germanium layer 5 with an etchant such as hydrofluoric-nitric acid from the opening face of the side face 15 under the support 8a. Accordingly, a cavity G1 is formed between the silicon substrate 1 and the silicon layer 6. Since silicon has an etching selection ratio smaller than that of silicon germanium, the silicon germanium layer 5 can be selectively etched and removed while the silicon layer 6 remains. As a result, a structure is achieved in which the support 8a holds the silicon layer 6.

Subsequently, the silicon substrate 1 is thermally oxidized so as to form a buried insulation layer (BOX layer) 9 made of $SiO_2$ inside the cavity G1. Alternatively, the buried insulation layer 9 can be formed by CVD other than thermally oxidizing the silicon substrate 1.

Figure 11A:
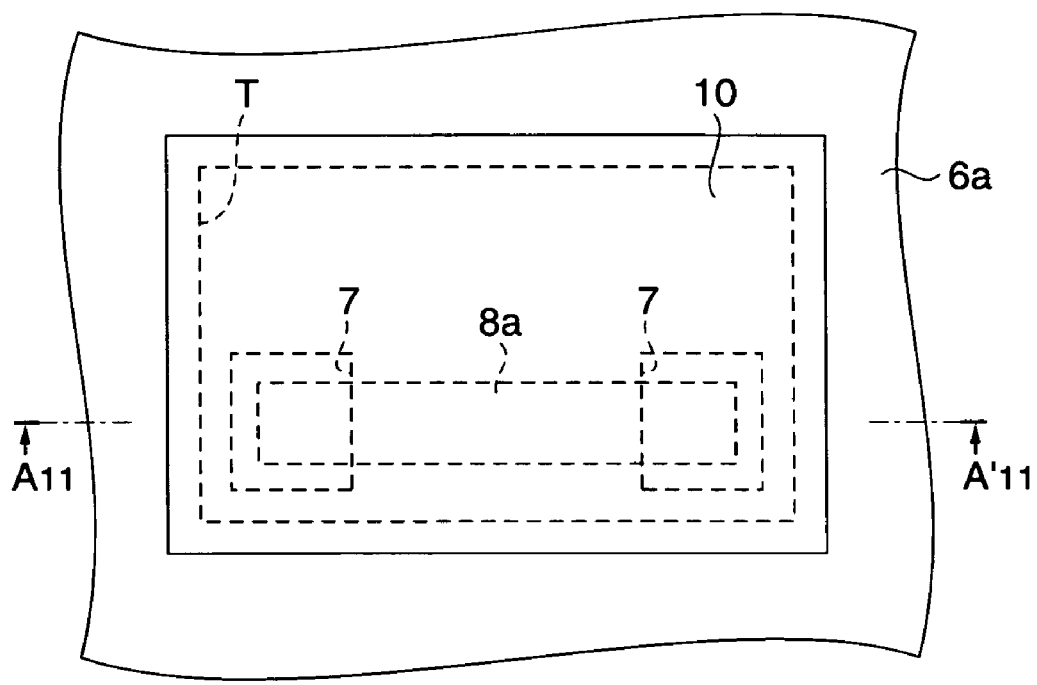
FIGS. 11A and 11B are schematic process views illustrating a method for manufacturing a semiconductor substrate according to the first embodiment of the invention.
Figure 11B:
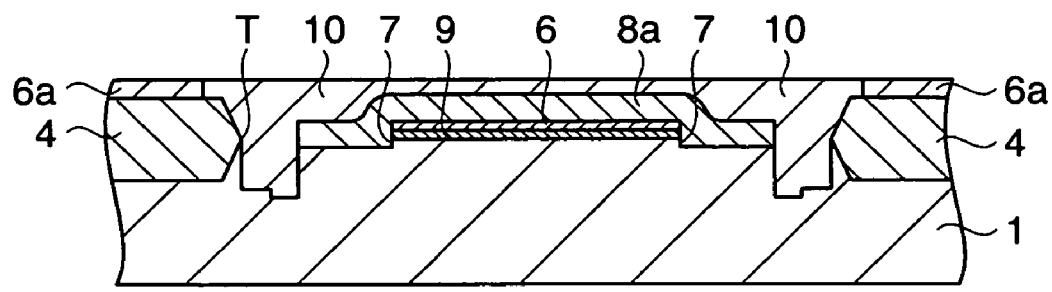

Next, an insulation film 10, which is for isolating elements and made of $SiO_2$ or the like, is formed on the whole upper surface of the silicon substrate 1 by CVD. The whole upper surface of the silicon substrate 1 is planarized by chemical mechanical polishing (CMP), for example, so as to remove a part of the insulation film 10 as shown in FIGS. 11A and 11B. Since CMP is a planarization treatment performed by chemical etching with chemicals and mechanical polishing with polishing compounds, the polysilicon layer 6a can be used as a stopper in CMP by utilizing a difference in chemical properties between the insulation film 10 and the polysilicon layer 6a.

While a case in which the insulation film 10 is planarized up to a position not reaching the upper surface of the support 8a is shown in the embodiment, the planarization treatment may be performed up to the depth at which a part of the support 8a is removed by controlling the height of the polysilicon layer 6a, for example.

Figure 12A:
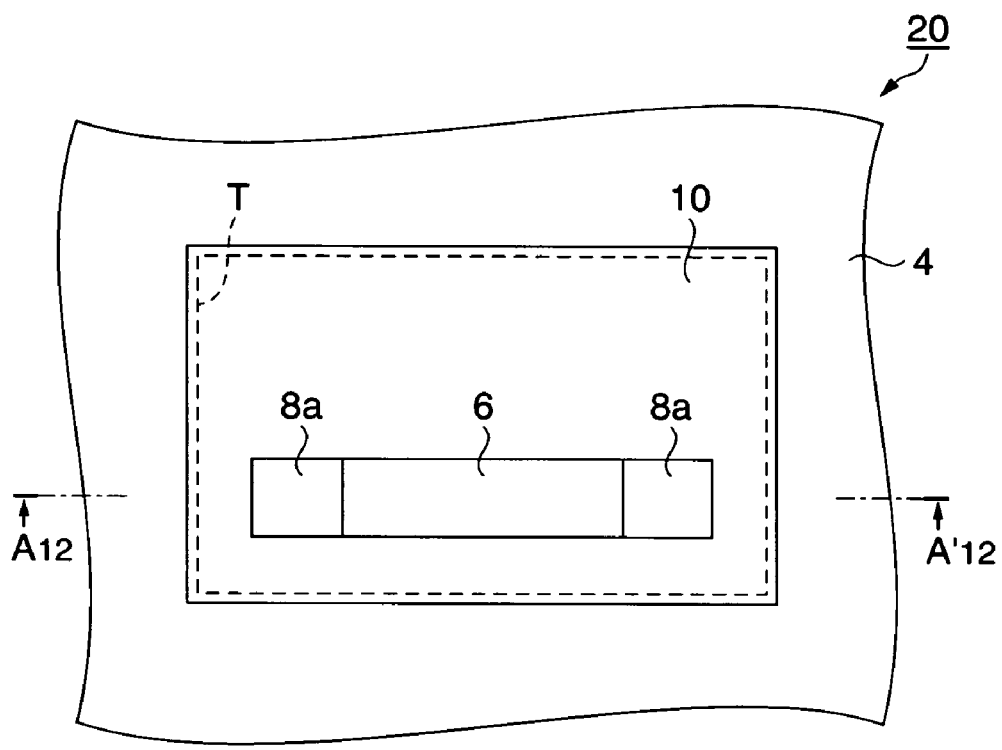
FIGS. 12A and 12B are schematic process views illustrating a method for manufacturing a semiconductor substrate according to the first embodiment of the invention.
Figure 12B:
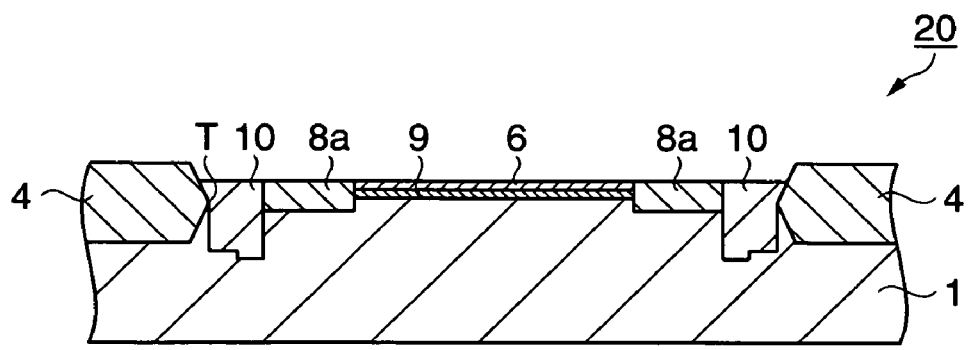

Then, a photoresist pattern (not shown) is patterned and formed so as to expose the SOI structure area T. The SOI structure area T on the upper surface of the silicon substrate 1 is etched as shown in FIGS. 12A and 12B. In this etching, the insulation film 10 in the SOI structure area T and the upper surface of the support 8a are almost uniformly removed up to a depth at which the upper surface of the silicon layer 6 is exposed. Consequently, an SOI structure, in which the upper surface of the silicon layer 6 is exposed, and the silicon layer 6 is isolated by the insulation film 10 and the buried insulation layer 9 can be formed on the silicon substrate 1. As a result, a semiconductor substrate 20 can be provided that has an SOI structure on the silicon substrate 1.

Here, it is a matter of course that a typical MOS element can be formed in an area excluding the SOI structure area T on the silicon substrate 1, which is a bulk silicon wafer, while the description is omitted in the embodiment. Therefore, the semiconductor substrate 20 can be manufactured on which a semiconductor element having an SOI structure and a semiconductor element without an SOI structure are mixedly fabricated.

According to the method for manufacturing the semiconductor substrate 20 of the first embodiment, the photoresist pattern 21 is formed on the support forming layer 8 in the process to form the support 8a. The photoresist pattern 21 includes the planar shape pattern of the support 8a and a pattern for masking the LOCOS film 4. In this regard, the pattern for masking the LOCOS film 4 is formed from a position outside the SOI structure area T, i.e., slightly inside the end part of the LOCOS film 4, so as not to fall on the SOI structure area T. Using the photoresist pattern 21 as a mask, the support forming film 8 is etched so as to form the support 8a. Further, the silicon layer 6, the polysilicon layer 6a, and the silicon germanium layer 5, which are in the SOI structure area T, are etched in this order.

This manufacturing method prevents the silicon layer 6 and the support forming film 8 from being formed on the LOCOS film 4 and supported as a cantilever in the vicinity of the circumference of the SOI structure area. Therefore, a problem does not arise in that the end part of each layer that is formed and supported as a cantilever is peeled off in a later process and adheres on a semiconductor substrate in process. As a result, a method for manufacturing a semiconductor substrate can be provided that achieves a stable production and a high yield rate.

Second Embodiment

Next, a method for manufacturing a semiconductor device according to a second embodiment of the invention will be described.

Figure 13A:
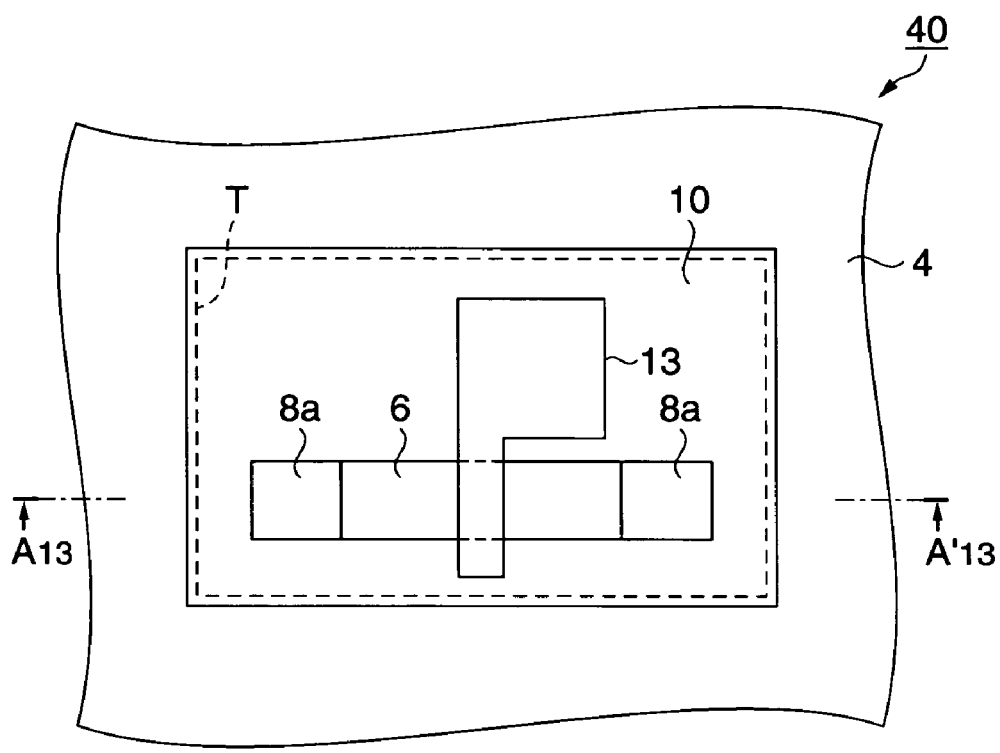
FIGS. 13A and 13B are schematic process views illustrating a method for manufacturing a semiconductor device according to a second embodiment of the invention.
Figure 13B:
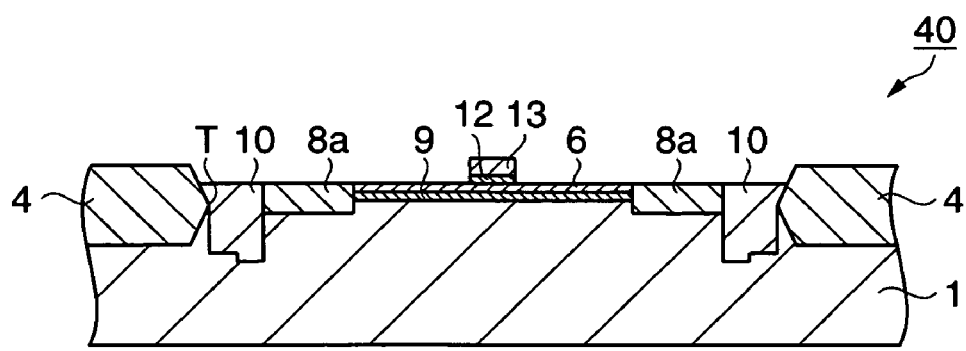
Figure 14A:
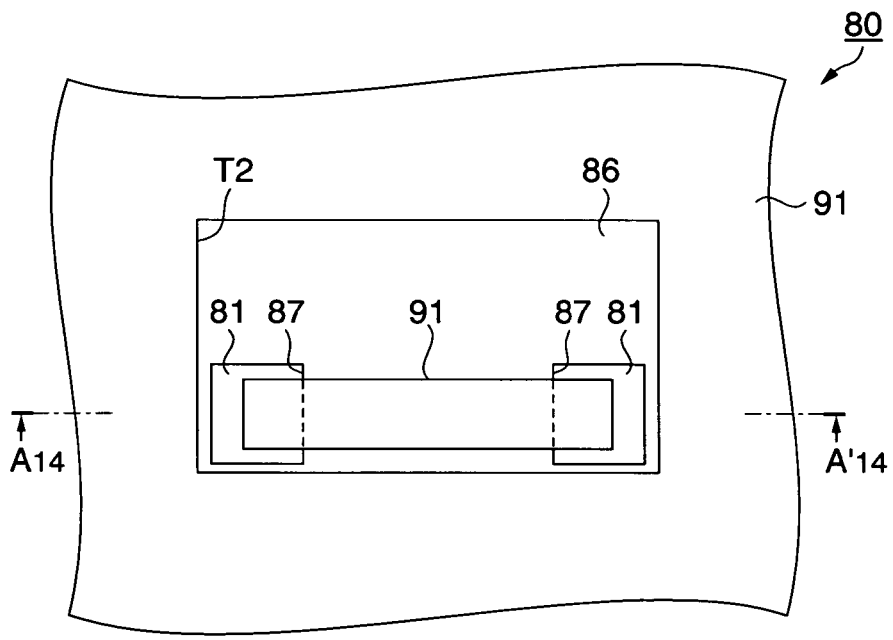
FIGS. 14A through 14C are explanatory views illustrating problems to be solved.
Figure 14B:
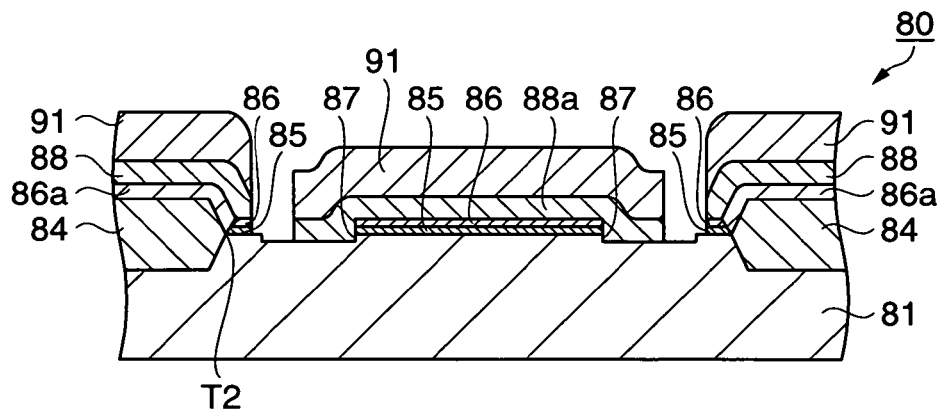
Figure 14C:
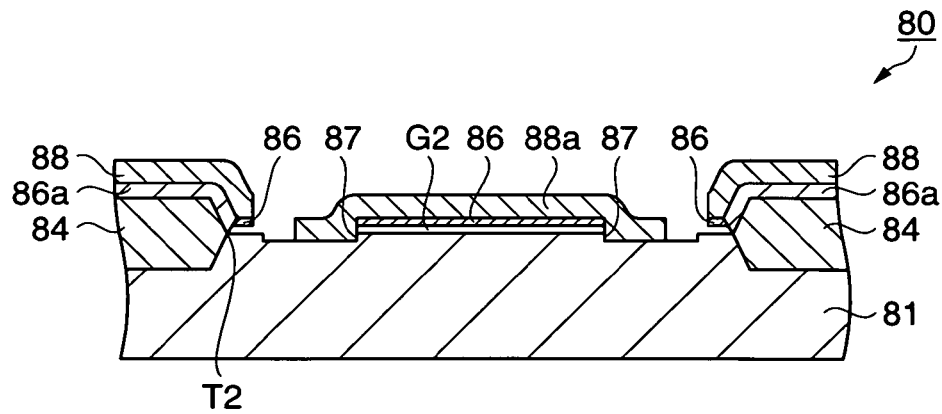

The method for manufacturing a semiconductor device forms a transistor shown in FIGS. 13A and 13B following the method for manufacturing a semiconductor substrate described in FIG. 1A through 12B.

FIGS. 13A and 13B are schematic views showing the method for manufacturing a semiconductor device according to the second embodiment of the invention. FIG. 13A is a schematic plan view. FIG. 13B is a schematic sectional-view taken along the line $A_{13}$-$A'_{13}$ in FIG. 13A.

First, the surface of the silicon layer 6 is thermally oxidized so as to form a gate insulation film 12 on it. Then a polycrystalline silicon layer is formed by CVD, for example, on the silicon layer 6 on which the gate insulating film 12 has been formed. The polycrystalline silicon layer is patterned by using a photolithography technique so as to form a gate electrode 13 on the gate insulation film 12.

Next, by ion implantation of an impurity such as As, P, or B to the silicon layer 6 using the gate electrode 13 as a mask, an LDD layer (not shown) made of a lightly doped layer arranged on the both sides of the gate electrode 13 is formed on the silicon layer 6. After an insulating layer is formed on the silicon layer 6 provided with the LDD layer by CVD or the like, sidewalls (not shown) are formed respectively on the sides of the gate electrode 13 by etching back the insulating layer by dry etching such as RIE. Next, by ion implantation of an impurity such as As, P, or B to the silicon layer 3 using the gate electrode 13 and the sidewalls as masks, a transistor is formed in which source and drain layers (not shown), each of which is made of heavily doped layer and disposed at the side of respective sidewalls, are formed. As a result, a semiconductor device 40 having an SOI structure is achieved.

The method for manufacturing the semiconductor device 40 prevents the silicon layer 6 and the support forming film 8 from being formed on the LOCOS film 4 and supported as a cantilever in the vicinity of the circumference of the SOI structure area, since the semiconductor substrate 20 is used that is made by the method of the first embodiment. Therefore, a problem does not arise in that the end part of each layer that is formed and supported as a cantilever is peeled off in a later process and adheres on a semiconductor substrate in process. As a result, a method for manufacturing a semiconductor device can be provided that achieves a stable production and a high yield rate.

What is claimed is:

1. A method for manufacturing a semiconductor substrate, comprising:
   forming a silicon on insulator (SOI) area and an element isolation film on a semiconductor base;
   forming a first semiconductor layer on the semiconductor base in the SOI structure area;
   forming a second semiconductor layer having an etching selection ratio smaller than an etching selection ratio of the first semiconductor layer on the first semiconductor layer;
   removing a part of the second semiconductor layer and a part of the first semiconductor layer in the SOI structure area so as to form a recess exposing the semiconductor base and supporting a support;
   forming a support forming layer on the semiconductor base so as to bury the recess and cover the second semiconductor layer;
   etching an area excluding the recess, an element area, and an area covering the element isolation film so as to form the support and an opening face exposing a part of end parts of the first semiconductor layer and the second semiconductor layer, the opening face being positioned under the support;
   removing the first semiconductor layer and the second semiconductor layer that are disposed at a border between the element isolation film and the SOI structure area and in a vicinity of the border;
   etching the first semiconductor layer through the opening face so as to form a cavity between the second semiconductor layer and the semiconductor base;
   forming a buried insulation layer in the cavity;
   forming an insulation film above the second semiconductor layer; and
   planarizing above the second semiconductor layer so as to remove a part of the support.

2. The method for manufacturing a semiconductor substrate according to claim 1, wherein the first semiconductor layer is a silicon germanium layer and the second semiconductor layer is a silicon layer.

3. A method for manufacturing a semiconductor device, comprising forming a transistor on the second semiconductor layer after performing the method for manufacturing a semiconductor substrate according to claim 1.

* * * * *